United States Patent [19]
Mantell

[11] Patent Number: 5,436,493
[45] Date of Patent: * Jul. 25, 1995

[54] COLOR IMAGING CHARGE-COUPLED ARRAY WITH MULTIPLE PHOTOSENSITIVE REGIONS

[75] Inventor: David A. Mantell, Rochester, N.Y.

[73] Assignee: Xerox Corporation, Stamford, Conn.

[*] Notice: The portion of the term of this patent subsequent to Jan. 3, 2012 has been disclaimed.

[21] Appl. No.: 292,145

[22] Filed: Aug. 18, 1994

Related U.S. Application Data

[63] Continuation of Ser. No. 18,587, Feb. 17, 1993, Pat. No. 5,378,916.

[51] Int. Cl.$^6$ .............................. H01L 27/14
[52] U.S. Cl. .................... 257/440; 257/443; 257/251; 257/184; 257/225
[58] Field of Search ............ 257/184, 53, 59, 431, 257/440, 443, 466, 251, 222, 226, 225

[56] References Cited

U.S. PATENT DOCUMENTS 5,107,318  4/1992  Makiuchi et al. ............. 257/458
5,130,776  7/1992  Popovic et al. ............... 257/461
5,182,670  1/1993  Khan et al. .................. 257/17

Primary Examiner—Robert P. Limanek
Assistant Examiner—David B. Hardy
Attorney, Agent, or Firm—R. Hutter

[57] ABSTRACT

A photosensitive apparatus comprises a single crystal structure, wherein different regions of the structure are of different compositions. A first photosensitive region comprises a material adapted to generate electron-hole pairs in an area thereof exposed to light within a predetermined first range of wavelength, and a second photosensitive region, comprises a material adapted to generate electron-hole pairs in an area thereof exposed to light within a predetermined second range of wavelength different from the first range of wavelength.

8 Claims, 3 Drawing Sheets

COLOR IMAGING CHARGE-COUPLED ARRAY WITH MULTIPLE PHOTOSENSITIVE REGIONS

This is a continuation, of application Ser. No. 08/018,587, filed Feb. 17, 1993, now U.S. Pat. No. 5,378,916.

This application incorporates by reference U.S. Pat. No. 5,298,771 entitled "Color Imaging Charge-Coupled Array with Photosensitive Layers in Potential Wells," having the same inventor and assignee as the present application.

The present invention relates to a photosensitive device, preferably in the form of a charge-coupled array (CCD), having a multi-region structure for imaging full-color images.

Charge-coupled arrays (CCD's) are generally defined as layered structures for the selective retention of charge in specific areas thereof, wherein the structure itself may serve as a shift register for selective serial readout of data in the form of the charged areas. Discrete areas within the CCD are caused to store charge because the electrical potential is lower in the particular area holding the charge than in the surrounding material. When it is desired to read out the charges as a serial signal, the charge in each area can be transferred from one area to its neighbor by suitably changing the potential on it and its neighbor so that charge flows from one area to the next. By applying charges to a linear series of electrodes along the array, typically with some time period of overlap of charging adjacent electrodes, individual charge packets can be caused to move along the CCD. The system for transferring discrete charge packets from one area to the next until the charges are read out as a serial signal is colloquially known as the "bucket-brigade" method of readout. An early patent describing the shift register operation of a CCD is U.S. Pat. No. 3,971,003.

One special type of CCD is the photosensitive, or "imaging," CCD, wherein discrete areas of charge, which may be read out as serial signals, are initially created in the CCD by the imagewise focusing of light onto the structure. With certain materials, such as aluminum, gallium, and arsenic compounds and combinations in an ordered crystal structure, photons focused on the material will create electron-hole pairs in areas corresponding to the distribution of light in the image. Thus, the CCD forms a linear array of photosensors upon which narrow sections of an image can be recorded, while the CCD can output data related to the image. Such CCD's, particularly monochrome CCD's, are in common use in facsimile machines, digital copiers, and other scanners. One typical example of such an imaging CCD is shown in U.S. Pat. No. 4,658,278.

In digital scanning equipment, such as facsimile machines, digital copiers, or any apparatus in which a hard-copy original is read and the signals converted to digital data, a common arrangement is to provide a series of very small photodetectors and cause the photodetectors to move relative to the hard-copy original. These photodetectors are arranged in a linear array at a spacing typically on the order of 200 to 400 detectors per inch, and this linear array is moved across the original so that the photodetectors are disposed to the original one line at a time. Most scanners and facsimile machines currently in common use are monochrome, that is, insensitive to the colors on a hard-copy original, and therefore most imaging CCD's are sensitive merely to gradations of dark and light. For color scanning devices, one common arrangement is to selectively interpose one or another color filter between the hard-copy original and the photodetectors, and then scan the hard-copy original a number of times, each time with a different color filter, thus ending up with a set of discrete "batches" of data, each batch representing the separation of one color from the document. In order to provide subsequent display or printout, the separate batches are superimposed to reassemble the full-color document. Another known technique is to provide three separate linear arrays, typically arranged in parallel and in close proximity to one another, each separate linear array having a small color filter associated therewith. Despite the color filter associated with each array, the underlying photosensitive structure of each such array is typically identical; this system merely controls the nature of light going into each of the respective linear arrays. However, there has been attempts in the past to create photosensitive structures for use in CCD's which are inherently sensitive to various colors.

U.S. Pat. No. 4,383,269 discloses a photodetector having an energy band structure which causes one type of charge carrier, either an electron or a proton, to ionize at a faster rate than the other type of charge carrier. The photodetector is preferably formed from semiconductors including gallium, aluminum, arsenic, and phosphides.

U.S. Pat. No. 4,432,017 discloses a high density imaging CCD having a bilinear array of photosites on a single integrated circuit chip. The photosites are offset relative to each other in two rows and coupled to a respective pair of storage registers and shift registers.

U.S. Pat. No. 4,847,489 discloses a superlattice photodetector arrangement having a plurality of photosensitive detector elements, each element having a multi-layer structure of alternating positively and negatively doped photosensitive semiconductor material. Control electrodes are arranged vertically with respect to the semiconductor layers, and adapted to receive a control voltage in order to control the spectral light sensitivity thereof.

U.S. Pat. No. 5,138,416 discloses a multi-layer color photosensitive element having different layers, each sensitive to a different primary color, and differing primarily by composition. Charge is collected from the various layers according to an amount of time for light of various colors to travel through the layers.

Tokumitsu et al., "Photo-metalorganic Molecular Beam Epitaxy: A New Epitaxial Growth Technique," Journal of Vacuum Science and Technology Vol. 7, No. 3, May/June 1989, at 706–709, discloses a technique for making photosensitive crystal structures with specific arrangements of compositions.

In accordance with the present invention, there is provided a photosensitive apparatus comprising a crystal structure having a first photosensitive region, comprising a material adapted to generate electron-hole pairs in an area thereof exposed to light within a predetermined first range of wavelength, and a second photosensitive region substantially coplanar with the first photosensitive region, comprising a material adapted to generate electron-hole pairs in an area thereof exposed to light within a predetermined second range of wavelength different from the first range of wavelength.

Figure 1:
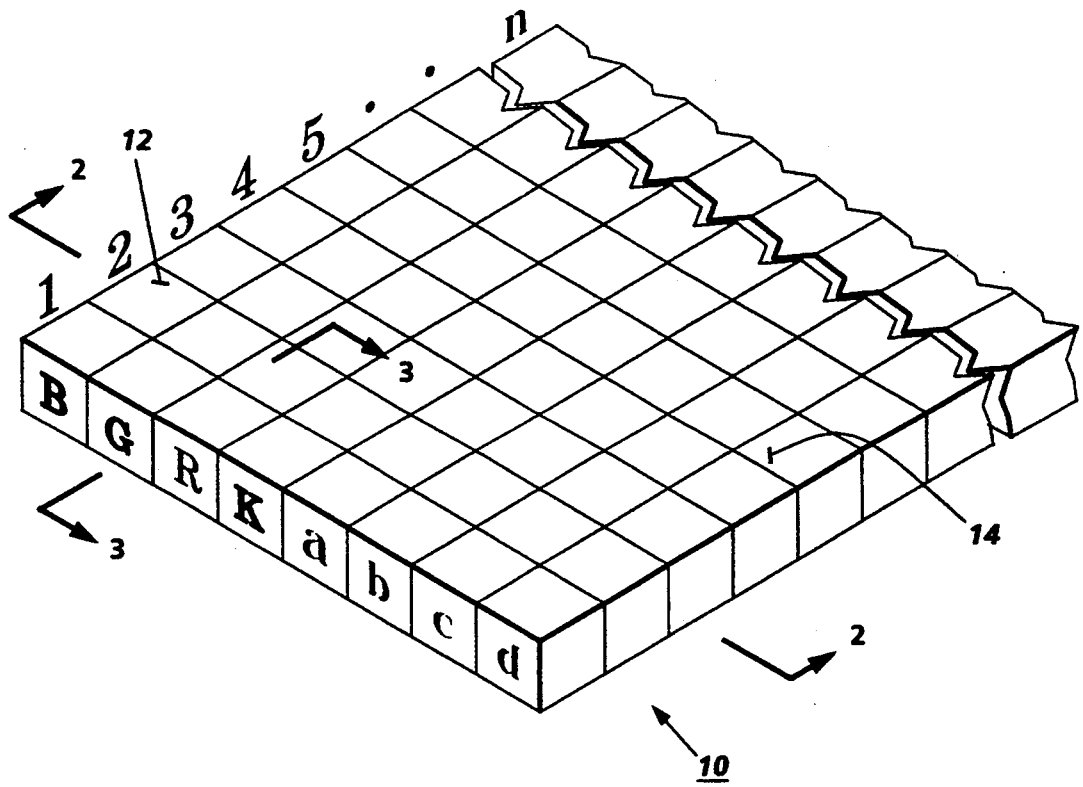
FIG. 1 is a schematic perspective view showing a CCD made according to the present invention.
Figure 3:
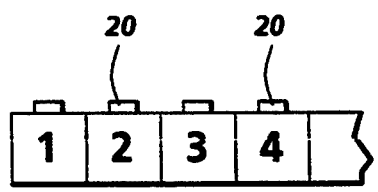
Figure 4:
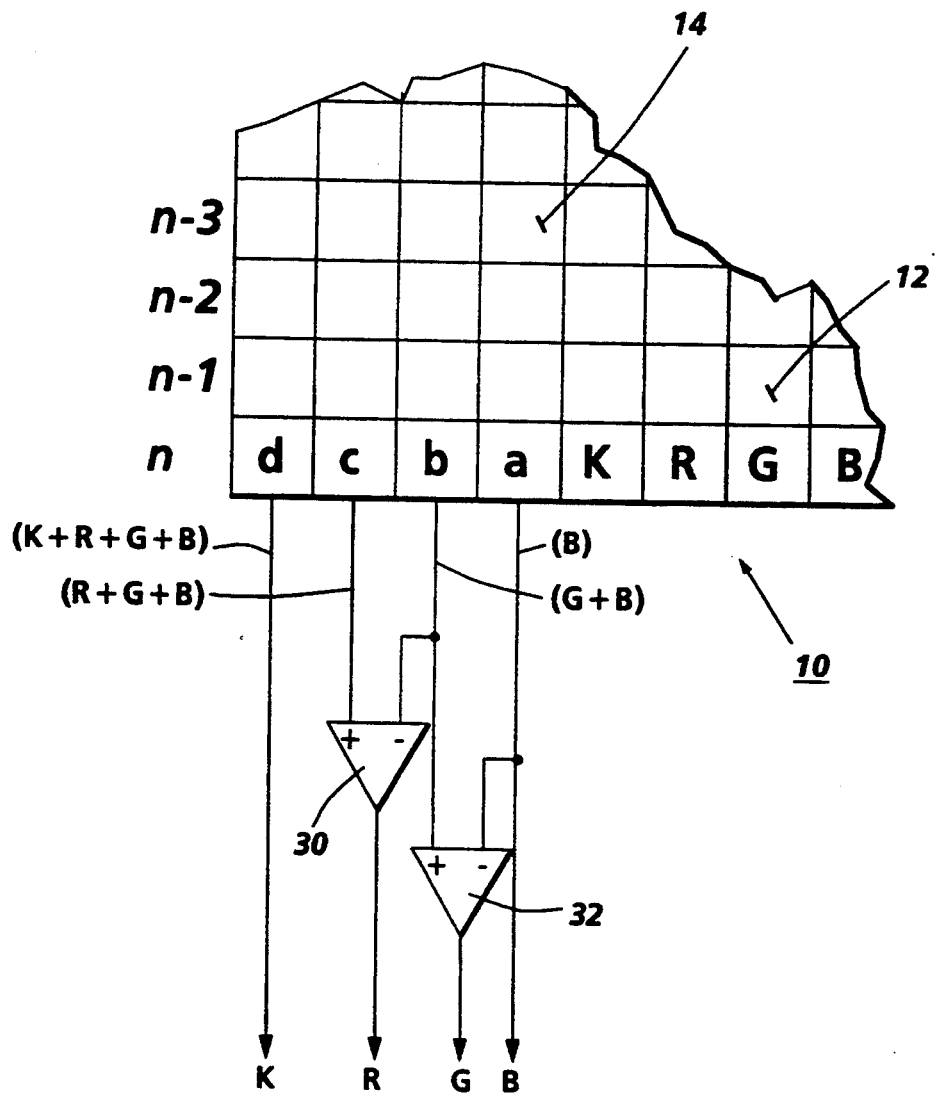
Figure 5:
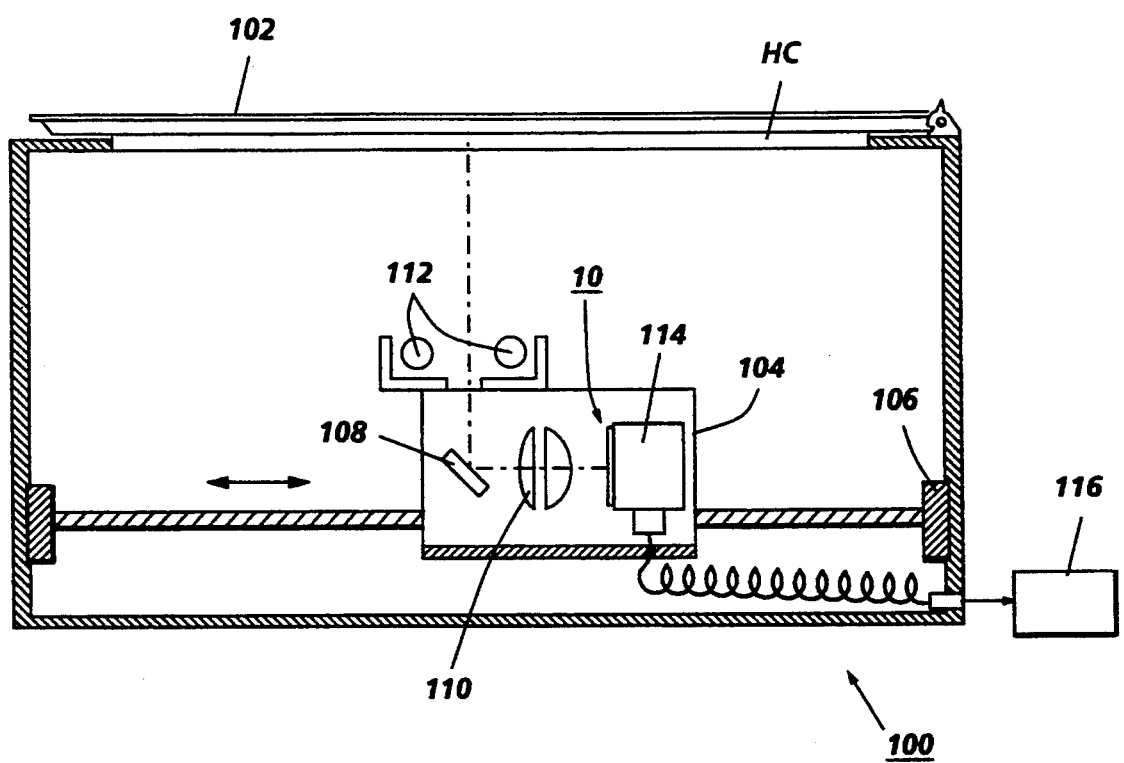

FIG. 3 sectional elevational view taken in the direction of the arrows along the line 3—3 of the CCD shown in FIG. 1;

FIG. 4 is a partially schematic or planar view of a differencing system for sorting signals output by a CCD made according to the present invention; and FIG. 5 is a schematic elevational view of a scanning apparatus in which a CCD according to the present invention would be suitable for use.

FIG. 1 shows a photosensitive device in the form of a CCD for full-color scanning, according to the present invention. The photosensitive device, generally indicated as 10, is in the form of a member having a single crystal structure; that is, the entire photosensitive device 10 is preferably made from a single crystal structure continuous throughout the device, as opposed to comprising separate crystal structures created separately and then abutted to each other. Although the entire member is made from a single crystal structure, as will be explained below, the composition of the structure will vary at different portions of the photosensitive device. Further, the device 10 may itself be a portion of a larger member, such as a wafer extending beyond the boundaries of the device shown in FIG. 1.

In order to be useful for a scanning apparatus, the photosensitive device 10 is of a generally elongated shape, and is generally divided along its length into a photosensitive portion 12 and opaque portion 14. The top surface of photosensitive portion 12 is divided into any number of regions in the form of parallel rows, such as shown as B, G, R, and K, which, as will be explained in detail below, correspond to blue, green, red and white (for a black image)light respectively. In addition, the opaque portion 14, which is insensitive to light, is functionally divided into rows a, b, c, and d. This arrangement of rows in both the photosensitive portion 12 and opaque portion 14 can be seen clearly in the cross-sectional view of FIG. 2.

Each row B, G, R, K and a, b, c, d of the device 10 is, in its other dimension, divided into pixel sections numbered in FIG. 1 as 1, 2, 3, ... n. These pixel sections correspond to picture elements (pixels) by which scanned-in images from the exposure of the photosensitive device 10 is converted into image data. The intersection of the pixel sections with the rows in portion 12 form individual photosites, such that each pixel in the array has assigned to it four photosites (one for each color) in portion 12, and, in the corresponding portion 14, four "place holders" which operate as shift registers, in a manner which will be explained in detail below. A typical spacing of such pixel sections in a full-width one-to-one scanning apparatus would be 200 to 400 pixel sections per inch. However, as many scanning apparatus employ reduction lenses, the actual size of the pixel sections may be as small as 600 to 800 per inch. Generally, reduction lenses are employed in conjunction with CCDs because there may be cost advantages to having a photosensitive device which is smaller in absolute terms, even if a higher resolution on the devices is required. The individual pixel sections for each row B, G, R, K and a, b, c, d are aligned for each row, as can be seen in the cross-section of FIG. 3, which could be said to represent the pixel sections in any row.

Figure 2:
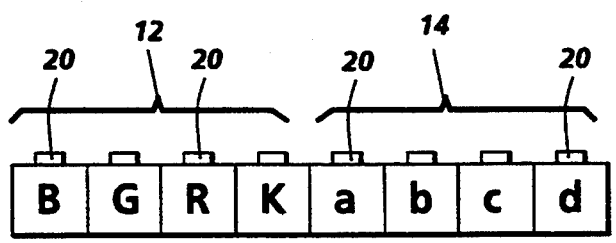
FIG. 2 is a sectional elevational view taken in the direction of the arrow, along the line 2—2 of the CCD shown in FIG. 1.

As can be clearly seen in the cross-sectional views of FIGS. 2 and 3, each pixel section in photosensitive portion 12 and each section a, b, c, d in opaque portion 14 has associated therewith an electrode 20. General techniques are known in the art for providing such electrodes 20 to individual pixel sections and other portions of a CCD whereby specific sections may be addressed without interfering with the transmission of light to any particular section as needed. (However, in the illustrated embodiment, opaque portion 14 is not intended to receive light, and thus no provision for allowing the transmission of light thereon will be necessary.) These various electrodes 20 are selectably addressed in sequences which would be familiar to one skilled in the art, whereby charge packets within various sections of the device 10 may be caused to migrate as desired from one area associated with a particular electrode 20, to an area associated with an adjacent electrode 20.

When the device 10 is exposed to light, particularly in imagewise fashion as would occur in the course of scanning a hard-copy original document, a "slice" of the image will be focused on the photosensitive portion 12 of device 10, and the photosites in the different pixel sections will receive different intensities of different color light depending on the image and the placement of the particular pixel section. For a full-color original, within each pixel section 1, 2, 3, ... n, different color sections B, G, R, K will respectively be sensitive to a particular component color (respectively, blue, green, red, and white) of the particular pixel associated with each column of pixel sections 1, 2, 3, ... n. Thus, for the endmost pixel 1, there may for example be a purple area in the hard-copy original, causing charge activity in the blue and red sections of the pixel section 1 to respective extents dependent on the actual hue of the original in that pixel area. (Although the primary colors are given here, as is typical in any full-color scanning system, the system may be designed for any kind of color separation as desired. Charge packets in the K zone relate to white light, and use may be made of this "gray" signal as desired in an image-processing system.)

In photosensitive imaging CCD's or other photosensitive devices, the energy associated with light will act to create specific quantities of electron-hole pairs. Either the electron or the hole of these created pairs may be retained to form "charge packets," in the photosensitive regions of the structure. Thus, the corresponding regions sensitive to individual primary colors in the multi-region structure of CCD 10 will, upon exposure to light, be energized (that is, charge packets of a certain charge magnitude will be created) to the extent that individual primary colors are present in the light in the particular pixel. In this way, a color separation is possible for each pixel.

Once the CCD has been exposed, as in part of a cycle wherein one of a series of line images forming a complete image are exposed onto the linear array of the CCD in a scanner, there begins a readout step in which the charge values in the photosensitive regions of the CCD are read out in the familiar "bucket-brigade" fashion to form a series of signals at the end of the CCD. In the preferred embodiment of the present invention, the readout of data for each color within each pixel section is a two-part process. First, the individual charge packets for each color within each pixel section are shifted first into the opaque portion 14 of the device 10. Thus, by applications of suitable charges for suitable amounts of time to the electrodes associated with the pixel section, the charge packets created by the exposure of light on the photosites in rows B, G, R, K are shifted into sections a, b, c, d respectively. In this way, the four possible charge packets (assuming there is an input for each of the four colors in that particular pixel section at that time) are shifted sequentially into the opaque section. This induced migration of charged packets from the photosensitive portion 12 to the opaque portion 14 for each pixel section in effect "clears" the photosensitive portion 12 so that another exposure cycle of photosensitive portion 12 may begin while the image data for the pixel section in the previous exposure is temporarily stored in opaque portion 14 for that pixel section.

In the second part of the read out process, the charge packets in rows a, b, c, d of opaque portion 14 are read out sequentially in parallel streams across the rows; that is, the charge packets in row a are moved in CCD "bucket-brigade" fashion across the device 10 from pixel section 1, to 2, to 3, etc. This sequential read out, induced by the proper application of suitable charges to the electrodes 20 associated with the sections of opaque portion 14, is familiar in the art of CCD shift registers. At the read out end of the device 10, as the charge packets associated with image data are fed out in parallel streams, there is created a sequence of charge values (based on the magnitude of the individual charge packets) which will form parallel serial streams of image data, each stream being representative of one color or white/black. Thus, the two-part read out process of the preferred embodiment of the claimed invention first shifts all the charge packets into opaque portion 14 to clear the photosensitive portion 12, and then the charge packets are downloaded sequentially from the end of the opaque section.

Of course, it is possible that for a more simple form of read out from the photosites in rows B, G, R, K in photosensitive portion 12, that serial readout across the columns can be performed directly from the ends of the respective rows or pixel sections in photosensitive portion 12.

In the illustrated embodiment, the series of electrodes 20 may be connected to an external circuit (not shown) to apply appropriate voltages to discrete areas of the array; thus the electrodes enable the shifting of charge packets across the array in various directions as needed. In the case of the multicolor CCD of the present invention, each column 1, 2, 3, . . . n of pixel sections in the photosensitive device will act as an independent CCD and the readout step will result in parallel data streams, each data stream representing one color of the row of pixels. This bucket-brigade technique generally consists of applying a series of potentials to the electrodes 20 in a sequence so that, by decreasing the potential to one side of a given pixel, the charge packet in one particular pixel section of the CCD will move over by the length of one pixel. This process is repeated, as is known in the art, until all of the image data, in the form of discrete charge packets associated with each pixel, is read out at the end of the CCD.

In constructing a photosensitive device such as 10 of a single crystal structure, an obvious concern is providing individual sections in the photosensitive area 12 which are inherently sensitive to specific wavelength of light. By having specific regions of the device inherently sensitive to specific wavelength ranges, the usual necessity for providing glass or plastic color filters of one type or another is avoided; ability to avoid such filters will increase the sensitivity, and thus the possible speed, of such a scanning device. According to the present invention, there is provided a single crystal structure wherein, although the structure is continuous throughout the member, the composition of the structure in various regions of the member is slightly different. It is known that certain crystal compositions are able to create charge packets when exposed to light of specific wavelength ranges.

In order to create the desired structure of regions sensitive to particular desired primary colors, there are many possible direct band-gap materials available, such as $(Al_xGa_{1-x})_yIn_{1-y}As$. It is also possible to use indirect gap materials for the photosensitive regions, such as ordered crystals of $Al_xGa_{1-x}As$. The proportion of aluminum to gallium in this ordered crystal structure (given as x) may be varied for sensitivity to a particular energy associated with a desired wavelength for a given region. The use of indirect gap materials is possible because there is a large increase in absorption for energies at and above the material's direct gap. The small amount of absorption below the direct gap can be corrected for once the signals are read out and converted to digital form. With these materials, a given composition will be sensitive, generally, to a certain wavelength and shorter wavelengths, in a range bounded only at one end. Thus, when preparing a structure for absorption of a specific set of wavelengths, differencing means, as will be described in detail below, are typically required to sort out signals representative of light of wavelength ranges bounded at two ends.

In brief, the best known proportions of aluminum to gallium are shown in the table below for a desired wavelength sensitivity:

In a four-color embodiment of the present invention, such as that shown in FIGS. 1-3, one possible arrangement of the compositions of the respective sections K, R, G, and B would be as follows: for the K region, sensitive to white light (the entire visible spectrum), the value x=0.3; for the R section (sensitive to red and all shorter wavelengths, such as green and blue), x=0.45; for the G section (sensitive to green and all shorter wavelengths, particularly blue), x=0.75; and for the B region (sensitive to blue and all shorter wave lengths in the visible spectrum), x=0.85. Of

| $Al_xGa_{1-x}As$ X= | Direct gap eV | $\lambda$ ($\mu$m) | Color (approx.) |
| --- | --- | --- | --- |
| 0.45 | 2 | .62 | red |
| 0.6 | 2.2 | .56 | yellow |
| 0.75 | 2.4 | .52 | green |
| 0.85 | 2.6 | .48 | blue |
| 0.9 | 2.8 | .44 | violet | course, the precise compositions of the respective sections, relative to the precise desired colors to be detected, will be a matter of design choice for a particular apparatus. As mentioned above, because the nature of the crystal structure of the preferred embodiment of the present invention causes a particular region to be sensitive to a particular color and all shorter wavelengths, there is typically required means for separating out the signals associated with various regions of the device 10 so that the output signals relate to specific double-bounded ranges of the color spectrum.

Opaque portion 14 of device 10 is not intended to be exposed to light, but it is preferably formed from the same crystal structure as the photosensitive portion 12. The composition of opaque portion 14 should be such that charge packets may be able to pass therethrough in a controllable manner, and so in the illustrated embodiment the value of x should be selected to optimize the passage of charge packets therethrough.

FIG. 4 is a partially-schematic view of the rudiments of differencing means by which the charge packets associated with different rows in the opaque portion 14, which have been transferred from respective rows in photosensitive portion 12, are sorted to yield signals relating to double-bounded wavelength ranges. Assuming in this embodiment that the charge packets created in rows B, G, R, and K are transferred seriatim to rows a, b, c, and d respectively in opaque portion 14, it will be noted that because of the cumulative nature of wavelength sensitivity of the various photosensitive regions, the charge packets in row b, which were transferred from row G, are related to the amount of light of green wavelength and shorter, particularly blue light; therefore, the charge packet in row b is representative of green light plus blue light. Similarly, the charge packets in row c, which were transferred from row R, were created by light of red wavelengths and shorter, in effect, red plus green plus blue. The charge packets in row a, originally from row B, are in this example primarily blue because blue is the shortest wavelength light to which the system is sensitive. Further, the charge packets in row d, which were transferred from the black/white row K, were created by the action of light from the entire visible spectrum.

Because the charge packets in row a, relating to blue light exclusively, and the charge packets in row d, wherein the actual color of the light is largely immaterial, do not contain charge relating to light not of interest to that row, the charge packets in rows d and a may be converted directly into (typically digital) signals for use by an image-processing system. The charge packets in rows c and b, however, contain, in addition to charge packets relating to the red and green light respectively, extra charge packets relating to other colors. Charge related to superfluous colors in rows b and c must, in effect, be separated out, leaving only the amount of charge relating to the color of interest. For this separating purpose, differencing means, such as the amplifiers shown as 30 and 32, are employed. In the case of the amplifier for the green light signal, as can be seen, the charge packets from row b, representative of green and blue light, have subtracted from them the charge relating to blue light only, which can be determined by the charge in row a for the same pixel. Thus, the subtraction $(G+B)-(B)=G$ is performed. Similarly, the charge in row c may have subtracted therefrom the green plus blue charge from row b and the subtraction $(R+G+B)-(G+B)=R$ is performed. This subtraction may be performed by any electronic means familiar in the art, such as operational amplifiers or digital systems.

Although it was mentioned above that one key advantage of the photosensitive device of the present invention is that it obviates the need for providing additional light filters, for example, of translucent plastic or glass, in combination with the photosensitive device, it may be possible that, for purposes of convenience of design of an apparatus, such light filters may be employed. The combination of light filters with various photosensitive regions of the photosensitive device 10 may be used to "fine-tune" the color acuity of a system, or may be used to eliminate the need for differencing means as shown in FIG. 4. The light filter may be applied directly to, or in close proximity to, individual wavelength-sensitive regions of the device 10, or alternately there may be provided in a scanner means for disposing one of a plurality of such filters as needed between the device 10 and the hard-copy original, for example, in a multi-pass scanning system.

FIG. 5 is a simplified elevational view showing the rudiments of a scanning device for a hard-copy original which may employ a photosensitive device of the present invention. The scanner 100 includes a pivotable top cover 102 under which a hard-copy original HC may be placed for scanning. Inside the scanner 100 is a carriage 104, adapted by a motor (not shown) to move along a track 106 to scan across the hard copy original C. Within the scanner 104 are optical elements such as mirror 108 and reducing lenses 110, which cause light from a light source 112 caused to reflect from the hard-copy original to be directed to a photosensitive device 10, such as that shown in FIG. 1. The reducing lenses 110 may be used to allow for a device 10 which is smaller than the width of the hard-copy original, or alternately a full-width device 10 may be provided. The full-color outputs from the device 10 may be downloaded into a buffer or other circuit element indicated as 114, to be converted into parallel streams of signals. These parallel streams of signals, one stream for each color, may then be sent, as needed, to image processing means 116 for whatever purpose.

There is presently known in the art at least one technique for creation of a unitary member having a single crystal structure, wherein specific regions of the main surface of the member can be provided with a specific composition while the member as a whole retains a consistent crystal structure. This preferred technique, known as metalorganic molecular-beam epitaxy, or MOMBE, is described, for example, in Tokumitsu et al., "Photo-metalorganic Molecular Beam Epitaxy: A New Epitaxial Growth Technique," published in the Journal of Vacuum Science and Technology Vol. 7, No. 3, May/June 1989, at 706–709.

Briefly, under this technique, metalorganic compounds or hydride reactant gases are introduced into an ultrahigh vacuum chamber and directed towards a crystal substrate. The metalorganic compounds are introduced as molecular beams, as opposed to in a viscous flow condition. This beam nature makes it possible to switch on and off the molecular beams of the reactant gases abruptly by using shutters. Most usefully for the present invention, it has been shown that, with the MOMBE technique, ternary and quaternary alloys having more than two group-V elements, such as GaAsP and InGaAsP, can be reproducibly grown. Further, photochemical reaction processes can be incorporated in MOMBE to prepare a superlattice structure. It is thought that the preparation of such a superlattice structure can be accomplished by switching on and off laser irradiation during the process, instead of operating shutters. Alternatively, one of the group-III or group-V compounds can be provided using a metalorganic source and all other species be provided using solid molecular-beam epitaxy sources. In this manner the amount of laser intensity can control the rate of decomposition and incorporation of only one of the species. The alloy composition grown with the laser irradiation will be different from that grown without the laser irradiation, and through this technique, the composition of the alloys can be controlled by the laser irradiation. By applying varying intensities laser irradiation across the surface of the growing film the composition can be controlled in an area selective manner. Therefore, it is evident that, using these techniques, the composition of a crystal structure such as in device 10 can be accurately controlled during the crystal growth process in such a way the desired compositions of the crystals are present in the desired positions within the device. Particularly relevant to the preferred embodiment of the present invention, Tokumitsu et al. states at 709 that the MOMBE technique can be used to control the composition of $Al_xGa_{1-x}As$ crystals.

While this invention has been described in conjunction with a specific apparatus, it is evident that many alternatives, modifications, and variations will be apparent to those skilled in the art. Accordingly, it is intended to embrace all such alternatives, modifications, and variations as fall within the spirit and broad scope of the appended claims.

I claim:

1. A photosensitive apparatus having a single crystal structure and defining a light-receiving surface, comprising:
    a first photosensitive region of the light-receiving surface, including a first material sensitive to light within a predetermined first range of wavelength and generating electron-hole pairs in an area thereof in response to being exposed to light within the predetermined first range of wavelength; and
    a second photosensitive region of the light-receiving surface, coplanar with the first photosensitive region of the light-receiving surface, including a second material sensitive to light within a predetermined second range of wavelength different from the first range of wavelength and generating electron-hole pairs in an area thereof in response to being exposed to light within the predetermined second range of wavelength.

2. An apparatus as in claim 1, wherein said first material comprises aluminum and gallium in a first relative proportion and said second material comprises aluminum and gallium in a second relative proportion not equal to the first relative proportion.

3. An apparatus as in claim 1, further comprising a third photosensitive region of the light-receiving surface including a third material in the crystal structure, generating electron-hole pairs in an area thereof in response to being exposed to light within a predetermined third range of wavelength different from the first range of wavelength and the second range of wavelength.

4. An apparatus as in claim 1, further comprising a plurality of electrodes associated with the first photosensitive region and the second photosensitive region, for transferring charge packets of electron-hole pairs within the first photosensitive region and the second photosensitive region.

5. An apparatus as in claim 4, wherein a subset of electrodes associated with the first photosensitive region and the second photosensitive region are associated with photosites corresponding to picture elements for the recording of an image.

6. An apparatus as in claim 1, further comprising a non-photosensitive region in the crystal structure, retaining a charge packet of electron-hole pairs.

7. An apparatus as in claim 6, wherein the non-photosensitive region retains charge packets of electron-hole pairs in discrete locations thereof.

8. An apparatus as in claim 7, further comprising electrodes associated with selected locations within the non-photosensitive region, for transferring charge packets of electron-hole pairs within the non-photosensitive region.

* * * * *